(12) United States Patent
Sung et al.

(10) Patent No.: US 10,811,304 B2
(45) Date of Patent: Oct. 20, 2020

(54) INCREASED ISOLATION OF DIFFUSION BREAKS IN FINFET DEVICES USING AN ANGLED ETCH

(71) Applicant: Varian Semiconductor Equipment Associates, Inc., Gloucester, MA (US)

(72) Inventors: Min Gyu Sung, Essex, MA (US); Sony Varghese, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/036,592

(22) Filed: Jul. 16, 2018

(65) Prior Publication Data
US 2020/0020570 A1 Jan. 16, 2020

(51) Int. Cl.
| | |
|---|---|
| H01L 29/66 | (2006.01) |
| H01L 21/762 | (2006.01) |
| H01L 21/3065 | (2006.01) |
| H01L 23/535 | (2006.01) |
| H01L 21/02 | (2006.01) |
| H01L 21/768 | (2006.01) |
| H01L 29/78 | (2006.01) |
| H01L 29/06 | (2006.01) |
| H01L 29/08 | (2006.01) |

(52) U.S. Cl.
CPC .... *H01L 21/76232* (2013.01); *H01L 21/0217* (2013.01); *H01L 21/02164* (2013.01); *H01L 21/3065* (2013.01); *H01L 21/76895* (2013.01); *H01L 23/535* (2013.01); *H01L 29/0649* (2013.01); *H01L 29/0847* (2013.01); *H01L 29/66545* (2013.01); *H01L 29/66636* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 4,580,331 A * | 4/1986 | Soclof | ................... | H01L 21/265 257/559 |
| 5,242,541 A * | 9/1993 | Bayer | .................... | G01Q 60/04 216/11 |
| 5,672,537 A * | 9/1997 | Carl | ....................... | H01L 21/763 438/386 |
| 7,687,407 B2 * | 3/2010 | Farber | ............... | H01L 21/76816 438/734 |
| 9,412,616 B1 * | 8/2016 | Xie | .................... | H01L 21/76224 |
| 2002/0148807 A1 * | 10/2002 | Zhao | .................... | B81C 1/00571 216/2 |
| 2006/0121739 A1 * | 6/2006 | Farber | ............... | H01L 21/31116 438/695 |
| 2015/0083581 A1 * | 3/2015 | Sherman | ............. | H01L 21/3065 204/192.34 |

* cited by examiner

*Primary Examiner* — Bilkis Jahan (57) ABSTRACT

Methods for forming semiconductor devices herein may include forming a trench in a substrate layer, wherein a hardmask is disposed atop the substrate layer, and implanting the trench at an angle relative to a top surface of the hardmask. The method may further include forming an oxide layer within the trench, wherein a thickness of the oxide layer along a bottom portion of the trench is greater than a thickness of the oxide layer along an upper portion of the trench.

9 Claims, 10 Drawing Sheets

INCREASED ISOLATION OF DIFFUSION BREAKS IN FINFET DEVICES USING AN ANGLED ETCH

FIELD OF THE DISCLOSURE

The present embodiments relate to semiconductor devices, and more particularly, to increasing isolation of diffusion breaks in FinFET devices using an angled etch.

BACKGROUND OF THE DISCLOSURE

The desire for increasingly high performance of integrated circuits has driven integrated circuit designs to very high integration densities and extremely small device sizes. High integration density resulting in minimization of the area occupied by each device increases the functionality provided on a chip of a given size, and reduces connection lengths between devices on an integrated circuit reduces signal propagation time (increasing potential clock speed) and increases immunity to noise. However, scaling of traditional designs of devices such as field-effect transistors (FETs) can compromise electrical characteristics such as control of the depletion layer in the transistor channel. Scaling also leads to the reduction of the ratio of resistance in conductive and non-conductive states. One reason for compromise of depletion layer control is reduced gate voltages necessary to reduce power dissipation needs are unable to control the charge carrier population at increasing distance from the gate electrode and at corners of the conduction channel.

To recover an adequate level of control of the depletion layer, so-called FinFET transistor designs have been developed. FinFETs are characterized by being formed with a thin, fin-shaped body of semiconductor material providing the source and drain regions with a conduction channel between them formed on an insulating surface, allowing the transistor gate to be formed at least on opposing sides of the thin fin. The fin is often formed to have a width thinner than can be resolved lithographically to reduce the distance of any location in the fin from one of the gate electrode portions.

As logic FinFET devices have scaled, better isolation becomes important. One conventional approach is to increase the isolation trench depth. Increasing the isolation trench depth is challenging for a subsequent gap-fill process. Furthermore, the etch profile of the trench is often wider at the top than at the bottom. Having a wider upper trench is not good for the well isolation at single diffusion break (SDB) layout. Accordingly, for isolation of single and double diffusion breaks, better isolation approaches are needed.

SUMMARY OF THE DISCLOSURE

In view of the foregoing, what is needed are approaches for increasing isolation of diffusion breaks in FinFET devices using an angled etch, e.g., a reactive ion etch. In some approaches, a method of forming a FinFET device may include patterning a set of fins from a substrate, and forming a diffusion break trench in the substrate by performing an angled etch disposed at a non-zero angle of inclination with respect to a perpendicular to a plane of the substrate. The diffusion break trench has a first width at a bottom of the diffusion break trench and a second width at a top of the diffusion break trench, wherein the first width is greater than the second width.

In some approaches, a method of forming a diffusion break within a FinFET device may include forming a hardmask over a finned substrate, and forming a trench in the finned substrate by performing an angled etch disposed at a non-zero angle of inclination with respect to a perpendicular to a plane of the finned substrate. The trench includes a bottom having a first width and a top having a second width, wherein the first width is greater than the second width.

In some approaches, a FinFET semiconductor device may include a set of active gates formed atop a substrate, and a diffusion break trench formed in the substrate between the set of active gates. The diffusion break trench has a first width at a bottom of the diffusion break trench and a second width at a top of the diffusion break trench, wherein the first width is greater than the second width.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), and plasma-enhanced CVD (PECVD). "Depositing" and/or "deposited" may also include semi-atmosphere CVD (SACVD) and high density plasma CVD (HDPCVD), rapid thermal CVD (RTCVD), ultra-high vacuum CVD (UHVCVD), limited reaction processing CVD (LRPCVD), and metal-organic CVD (MOCVD). "Depositing" and/or "deposited" may also include sputtering deposition, ion beam deposition, electron beam deposition, laser assisted deposition, thermal oxidation, thermal nitridation, spin-on methods, and physical vapor deposition (PVD). "Depositing" and/or "deposited" may also include atomic layer deposition (ALD), chemical oxidation, molecular beam epitaxy (MBE), plating, evaporation.

Figure 1:
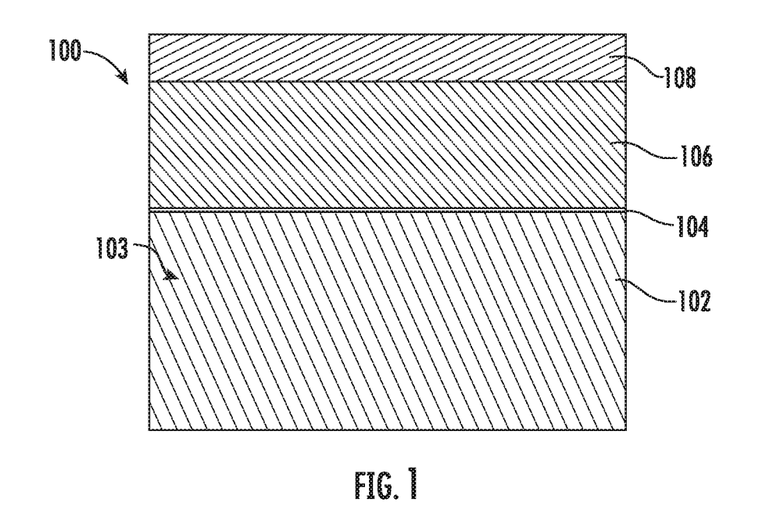
FIG. 1 depicts a side cross-sectional view of a semiconductor device in accordance with embodiments of the present disclosure.

Turning now to FIG. 1, there is shown a cross-sectional view of a FinFET semiconductor device (hereinafter "device") 100 according to embodiments of the disclosure. The device 100 may include a finned substrate (hereinafter "substrate") 102, an etch stop layer 104 atop the substrate 102, a dummy gate material 106 atop the etch stop layer 104, and a hardmask 108 atop the dummy gate material 106. In some non-limiting embodiments, the etch stop layer 104 may be silicon oxide deposited over an STI layer (not shown). The dummy gate material 106 may be a polysilicon deposited over the etch stop layer 104, and the hardmask 108 may be a silicon nitride deposited over the dummy gate material 106.

The term "substrate" and/or "finned substrate" as used herein are intended to include a semiconductor substrate, a semiconductor epitaxial layer deposited or otherwise formed on a semiconductor substrate and/or any other type of semiconductor body. All such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

In various embodiments, a set of fins 103 of the substrate 102 may be fabricated using any suitable process including one or more photolithography and etch processes. The photolithography process for forming the set of fins 103 may include forming a photoresist layer (not shown) overlying the substrate 102 (e.g., on a silicon layer), exposing the resist to a pattern, performing post-exposure bake processes, and developing the resist to form a masking element including the resist. The masking element may then be used to etch the set of fins 103 into the silicon layer, e.g., using reactive ion etch (RIE) and/or other suitable processes. In one embodiment, the set of fins 103 are formed using a sidewall image transfer technique. In another embodiment, the set of fins 103 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

Figure 2:
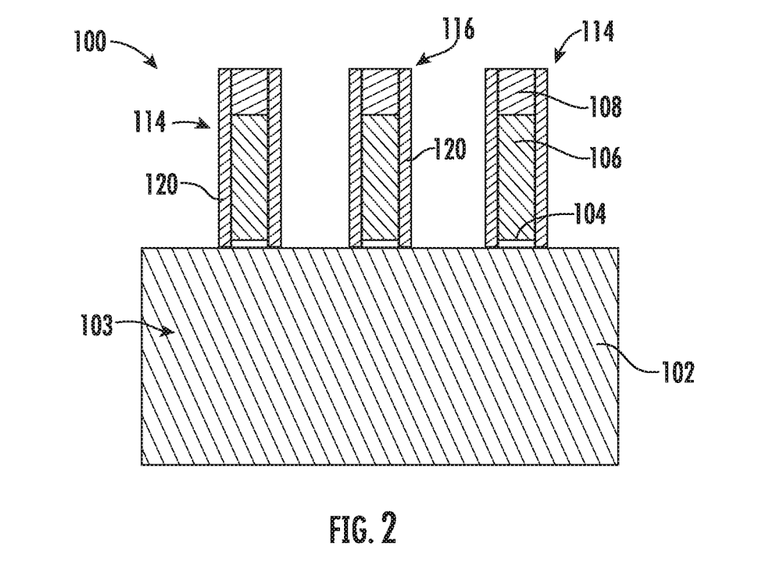
FIG. 2 depicts a side cross-sectional view of a semiconductor device including a set of active gates and a dummy gate in accordance with embodiments of the present disclosure.

As shown in FIG. 2, a set of active gates 114 and a dummy gate 116 may then be patterned from the dummy gate material 106 and the hardmask layer 108. A gate spacer 120 may also be formed along each of the set of active gates 114 and the dummy gate 116. In some embodiments, the gate spacer 120 may be deposited over the device 100 and then removed from atop the set of active gates 114 and the dummy gate 116 via an etch back process.

Figure 3:
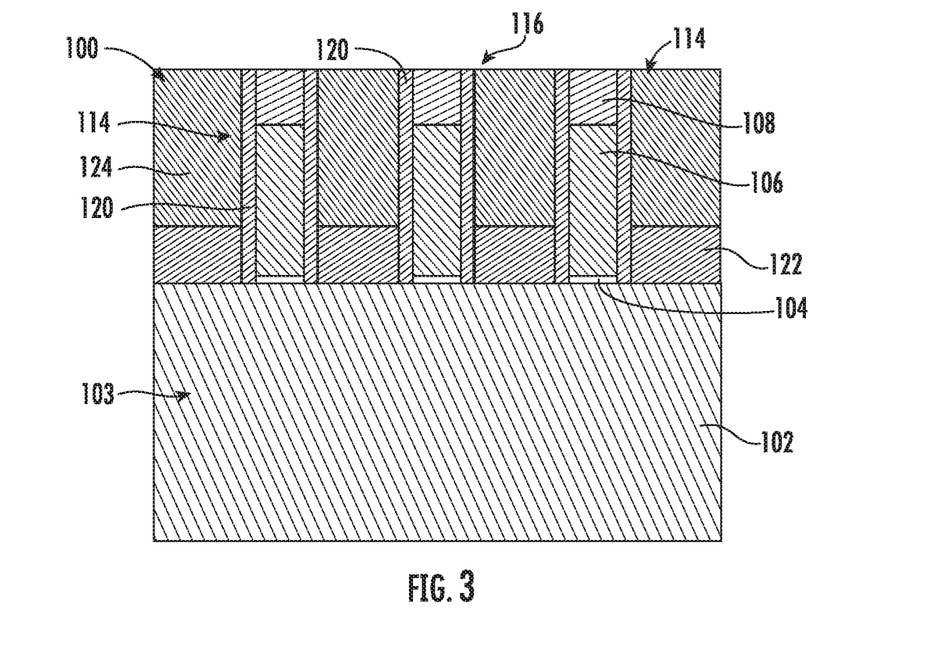
FIG. 3 depicts a side cross-sectional view of a semiconductor device including an interlayer dielectric in accordance with embodiments of the present disclosure.

As shown in FIG. 3, a source/drain (S/D) epitaxial layer 122 may then be formed over the substrate 102, for example, between each of the set of active gates 114 and the dummy gate 116. An interlayer dielectric (ILD) 124, such as a silicon oxide layer, may then be formed over the S/D epitaxial layer 122. In some embodiments, a silicon oxide fill and CMP process may be performed to remove the ILD 124 and from atop the set of active gates 114 and the dummy gate 116.

Figure 4:
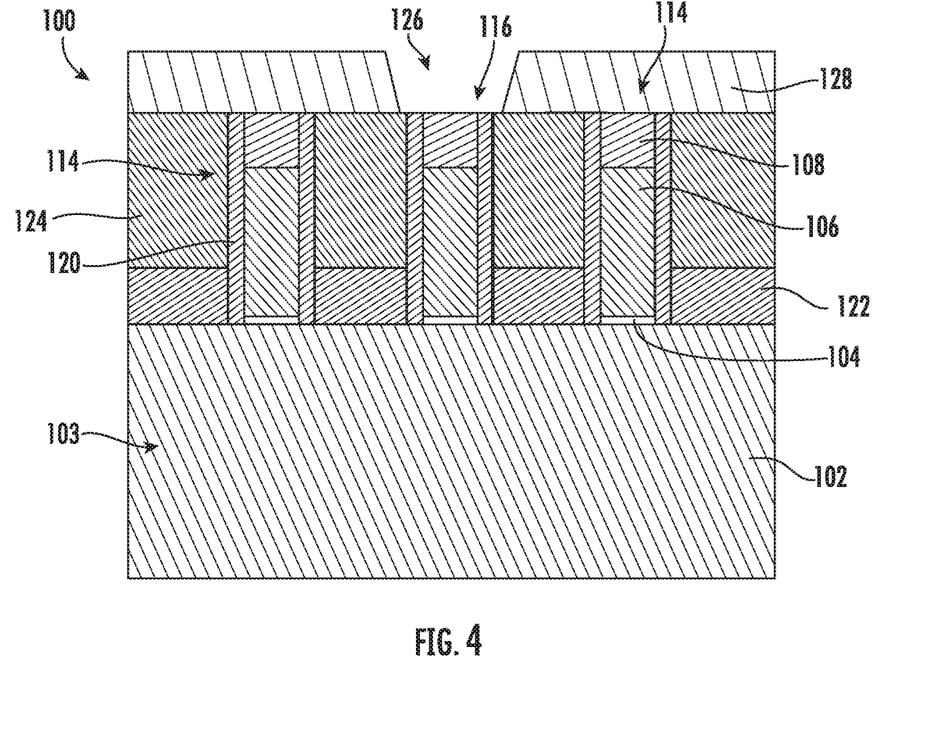
FIG. 4 depicts a side cross-sectional view of a semiconductor device including a patterning mask in accordance with embodiments of the present disclosure.

As shown in FIG. 4, an opening 126 may then be formed through a mask 128. As shown, the opening 126 may be positioned over the dummy gate 116, and the opening 126 may be selectively formed to a top of the dummy gate 116. In some embodiments, the mask 128 may be a lithography mask.

Figure 5:
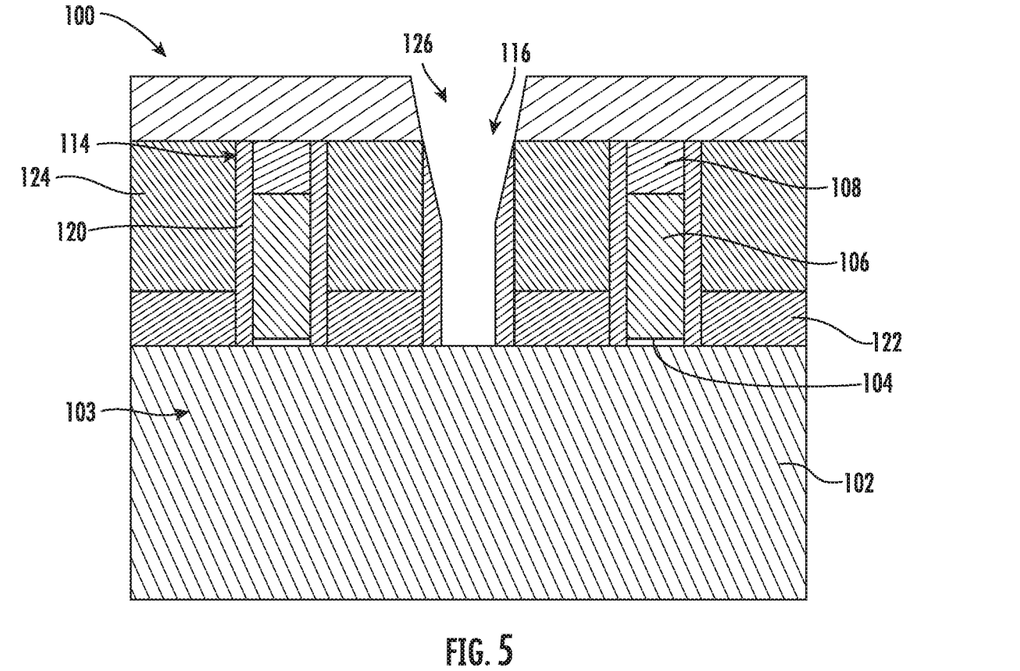
FIG. 5 depicts a side cross-sectional view of a semiconductor device including an opening therein in accordance with embodiments of the present disclosure.

As shown in FIG. 5, the dummy gate 116 may be opened by removing the etch stop layer 104, the dummy gate material 106, and the hardmask 108. In some embodiments, a reactive ion etch is first performed to remove the hardmask 108, followed by a poly pull to remove the dummy gate material 106. The etch stop layer 104 may then be removed selective to the substrate 102.

Figure 6:
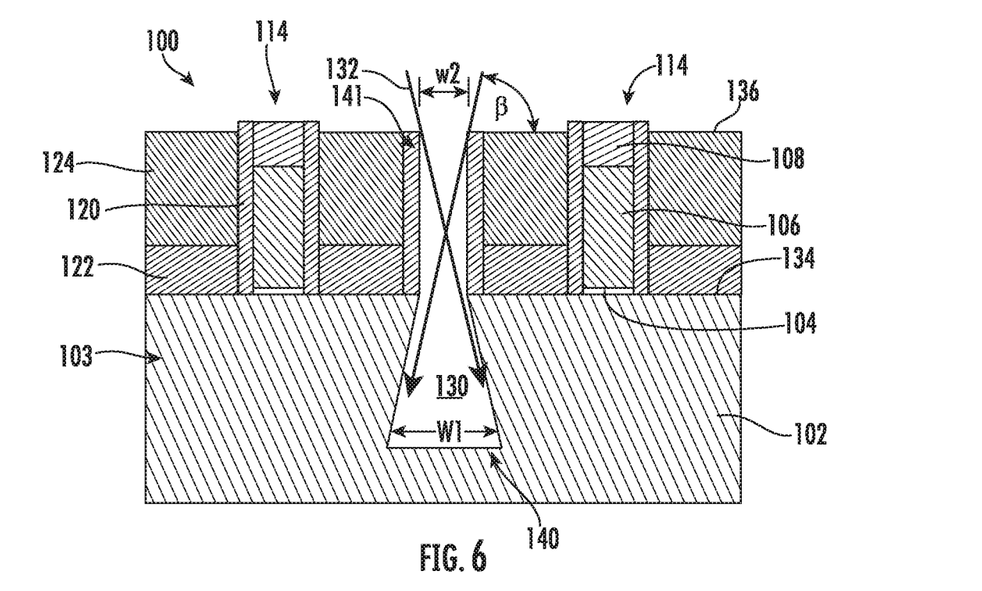
FIG. 6 depicts a side cross-sectional view of a semiconductor device etched to include a diffusion break trench in accordance with embodiments of the present disclosure.

As shown in FIG. 6, a diffusion break trench (hereinafter "trench") 130 may be formed in the substrate 102 by performing an angled etch, represented by arrows 132. The angled etch 132 (e.g., a reactive ion etch) may be disposed at a non-zero angle of inclination β with respect to a perpendicular to a plane 134 of the substrate 102 and to a top surface 136 of the ILD 124. As shown, the trench 130 has a first width 'w1' at a bottom 140 of the trench 130 and a second width 'w2' at a top 141 of the trench 130, wherein w1>w2. Unlike conventional RIE approaches resulting in trapezoidal shaped trenches, the angled etch 132 of the present embodiment may result in an inversely trapezoidal shaped trench 130.

In some embodiments, the angled etch 132 may be performed over two or more etch processes. For example, during operation, the angled etch 132 may be performed while the device 100 is in a first position. Following etching of the trench 130 in one position, the device 100 may be rotated (e.g., by 30, 45, 60, or 90 degrees), and another etch process may be applied to the trench 130. In other embodiments, the device 100 may be stationary, while an etch tool (not shown) is rotated/moved relative to the device 100.

Figure 7:
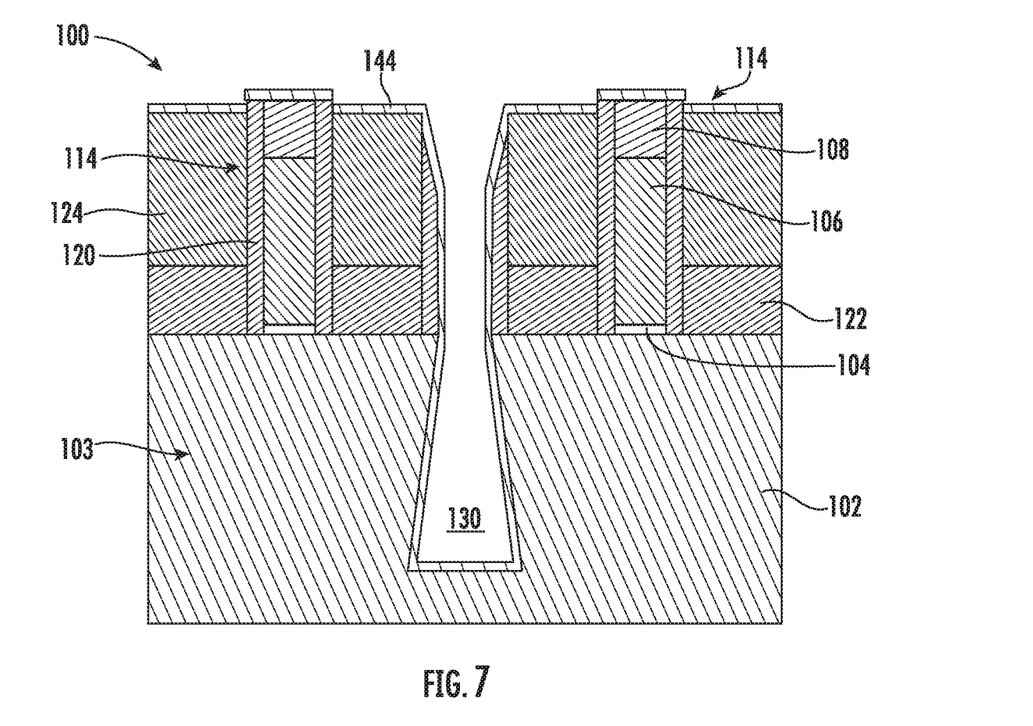
FIG. 7 depicts a side cross-sectional view of a semiconductor device including a barrier layer in accordance with embodiments of the present disclosure.

As shown in FIG. 7, a barrier layer 144 is next formed over the device 100, including within the trench 130. In some embodiments, the barrier layer 144 may be silicon nitride conformally deposited along the exposed surfaces of the device 100. The barrier layer 144 may serves as a buffer for steam anneal of a furnace chemical vapor deposition (FCVD).

Figure 8:
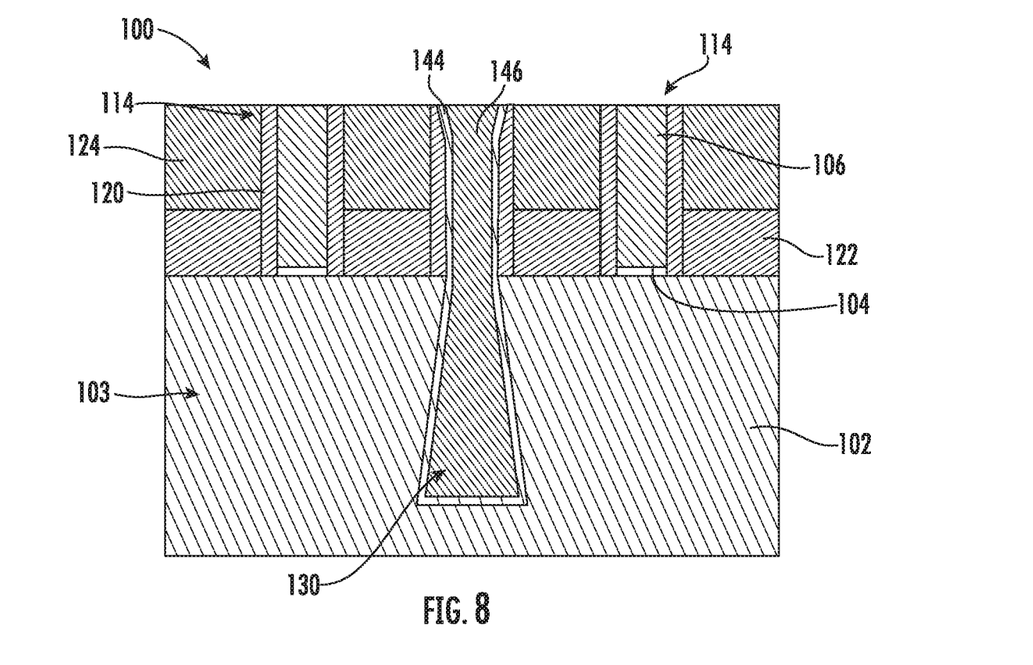
FIG. 8 depicts a side cross-sectional view of a semiconductor device including a second interlayer dielectric in accordance with embodiments of the present disclosure.

As shown in FIG. 8, a second ILD 146 may be formed within the trench 130. In some embodiments, the ILD 146 may be a SiO2 fill done by FCVD. A portion of the barrier layer 144 over the set of active gates 114 may then be removed by CMP. In some embodiments, the CMP may also remove the hardmask 108 (FIG. 7) from the set of active gates 114.

Figure 9:
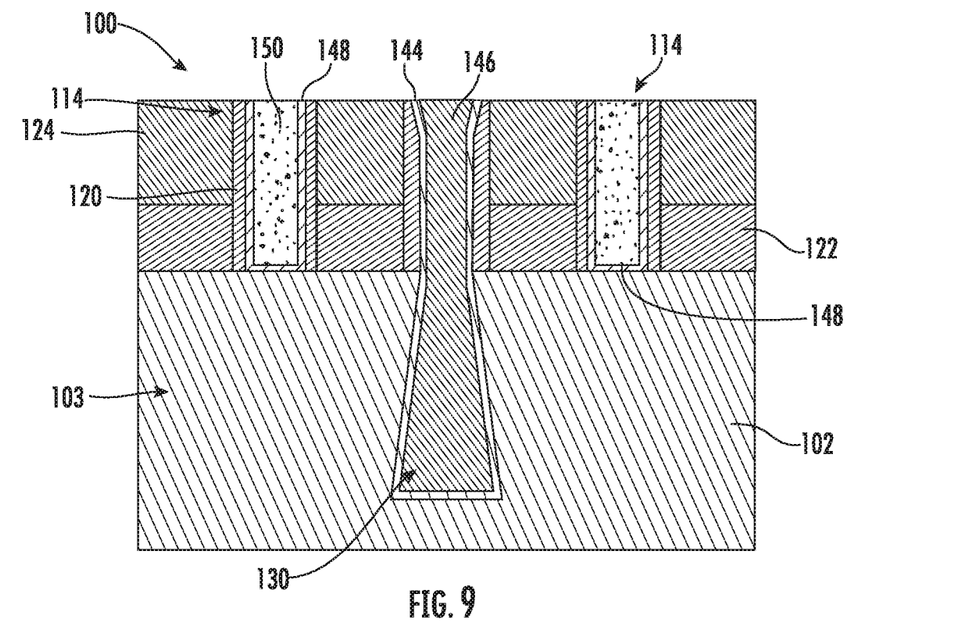
FIG. 9 depicts a side cross-sectional view of a semiconductor device including a gate dielectric and a metal formed in a set of active gates in accordance with embodiments of the present disclosure.

As shown in FIG. 9, the set active gates 114 may then be opened, for example, by removing the etch stop layer 104 and the dummy gate material 106. A gate dielectric 148 may then be formed within the set of active gates 114, followed by deposition of a metal 150 over the gate dielectric 148. In some embodiments, the gate dielectric 148 and/or the metal 150 may be formed over all of the device 100, and then recessed/removed by CMP.

Figure 10:
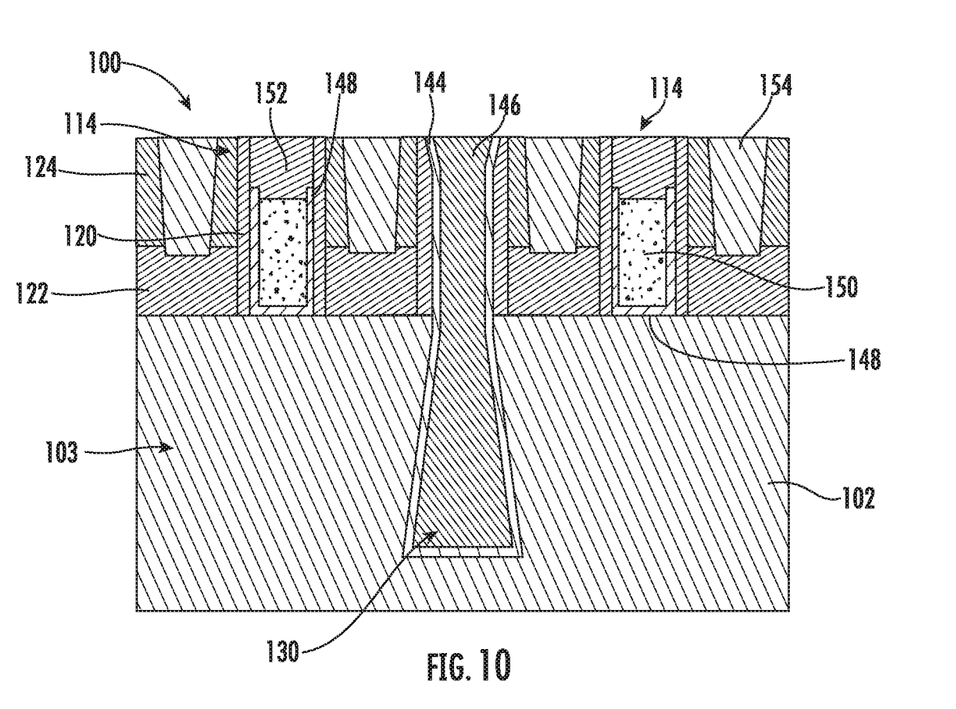
FIG. 10 depicts a side cross-sectional view of a semiconductor device including a capping layer and a set of source/drain contacts in accordance with embodiments of the present disclosure.

As shown in FIG. 10, the gate dielectric 148 and the metal 150 may then be partially recessed (e.g., etched), and covered with a capping layer 152. In some embodiments, the capping layer 152 is a layer of silicon nitride deposited and then planarized (e.g., CMP). As further shown, a set of S/D contacts 154 may be formed in the ILD 124, adjacent the set of active gates 114 and the trench 130.

Figure 11:
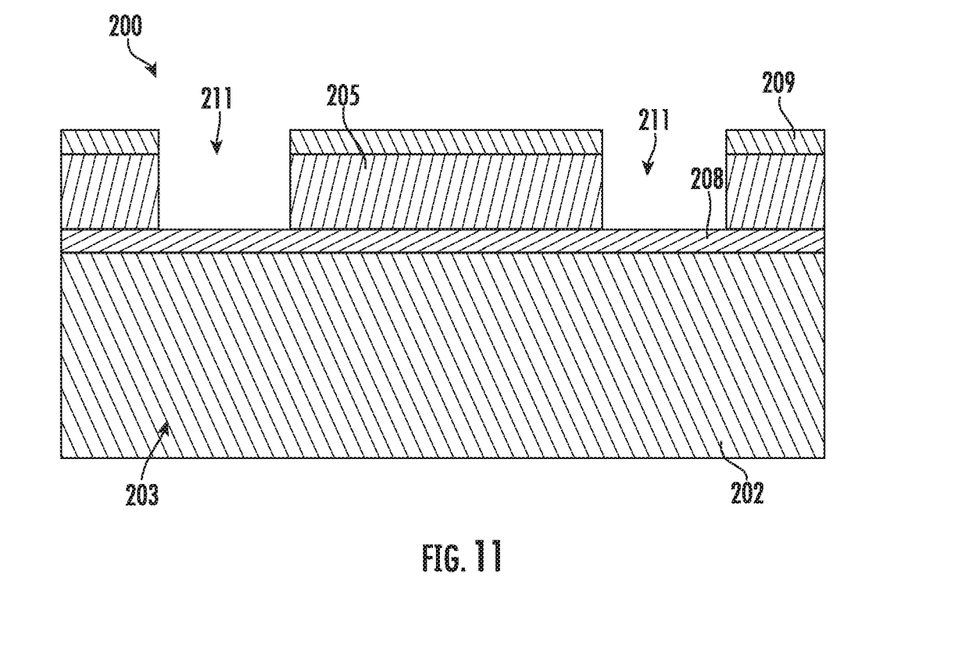
FIG. 11 depicts a side cross-sectional view of a semiconductor device including patterned layers in accordance with embodiments of the present disclosure.

Turning now to FIG. 11, there is shown a cross-sectional view of a FinFET semiconductor device (hereinafter "device") 200 according to embodiments of the disclosure. The device 200 may include a substrate (hereinafter "substrate") 202 including a set of fins 203, a hardmask 208 (e.g., silicon nitride) atop the substrate 202, and an optical planarization layer (OPL) 205 and a photoresist 209 over the hardmask 208. As shown, a set of openings 211 may be patterned through the OPL 205 and the photoresist 209.

Figure 12:
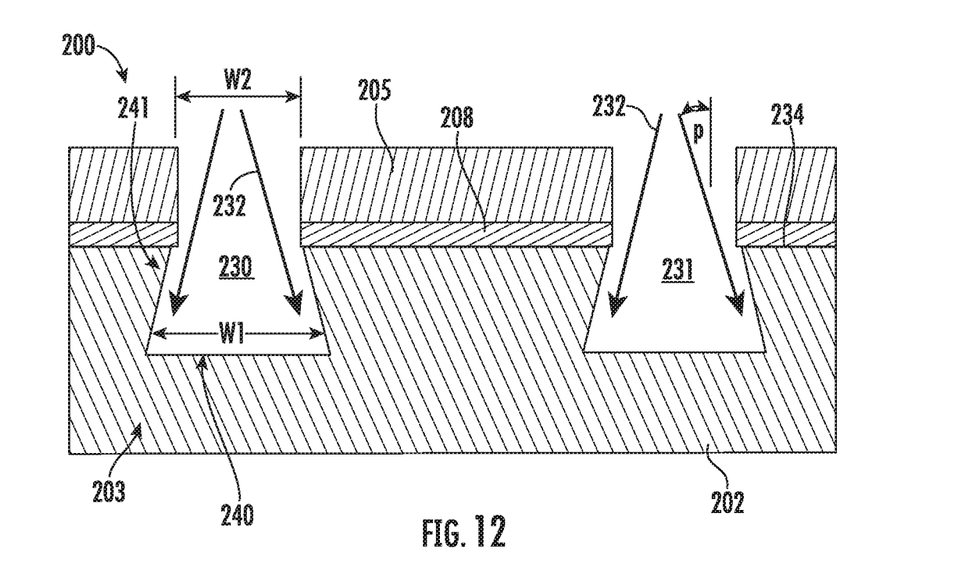
FIG. 12 depicts a side cross-sectional view of a semiconductor device etched to include a set of diffusion break trenches in accordance with embodiments of the present disclosure.

As shown in FIG. 12, a first diffusion break trench (hereinafter "trench") 230 and a second diffusion break trench (hereinafter "trench") 231 may then be formed through the hardmask 208 and into the substrate 202 to form the device 200 with a double diffusion break (DDB). In exemplary embodiments, the first and second trenches 230, 231 are formed by an angled etch (e.g., RIE), shown as arrows 232, disposed at a non-zero angle of inclination ρ with respect to a perpendicular to a plane 234 of the substrate 202. As shown, each of the first and second trenches 230, 231 includes a bottom 240 having a first width 'w1' and a top 241 having a second width 'w2', wherein w1>w2. In some embodiments, the first and second trenches 230, 231 will have the same or similar dimensions. In other embodiments, the first and second trenches 230, 231 differ from one another.

Figure 13:
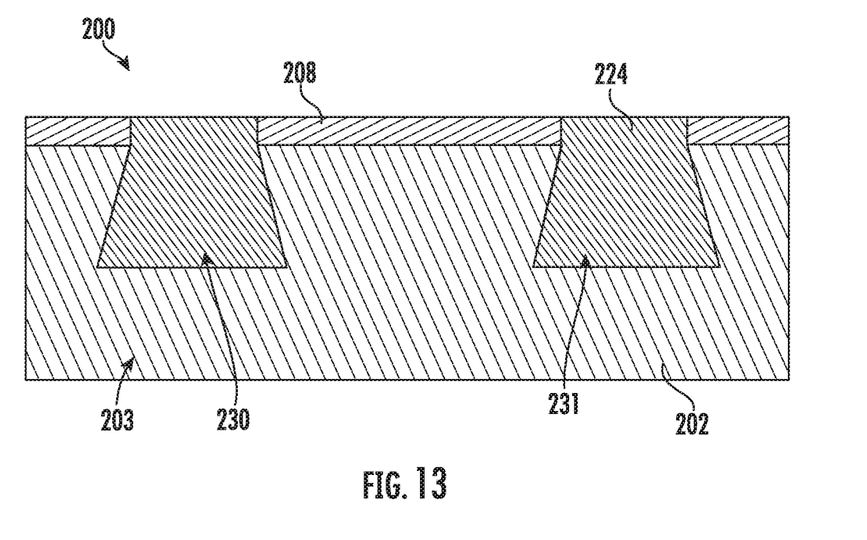
FIG. 13 depicts a side cross-sectional view of a semiconductor device including an interlayer dielectric formed in the set of diffusion break trenches in accordance with embodiments of the present disclosure.

As shown in FIG. 13, an interlayer dielectric (ILD) 224 may then be formed within the first and second trenches 230, 231. In some embodiments, the ILD 224 is silicon oxide formed over the device 200 and then planarized (e.g., CMP).

Figure 14:
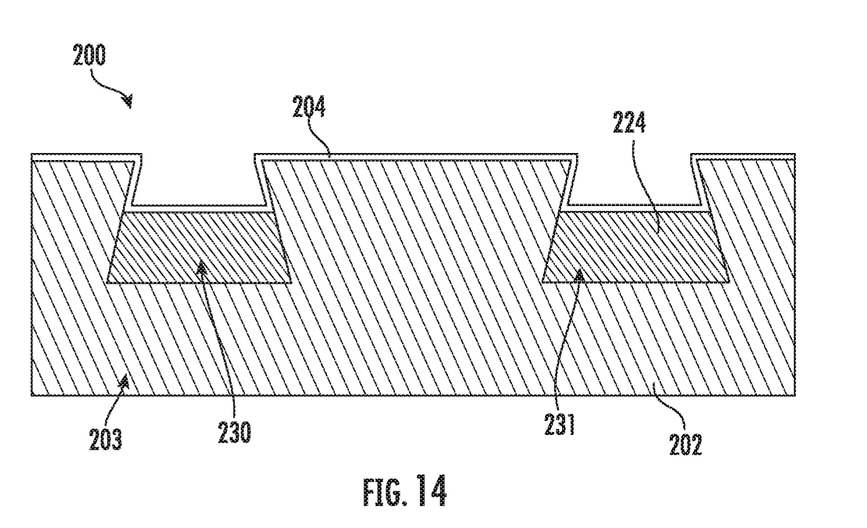
FIG. 14 depicts a side cross-sectional view of a semiconductor device including an etch stop layer in accordance with embodiments of the present disclosure.

Next, as shown in FIG. 14, the ILD 224 may be recessed within the first and second trenches 230 and 231, and an etch stop layer 204 may be formed over the exposed surfaces of the device 200. In some embodiments, the etch stop layer 204 may be a silicon oxide conformally deposited over the device.

Figure 15:
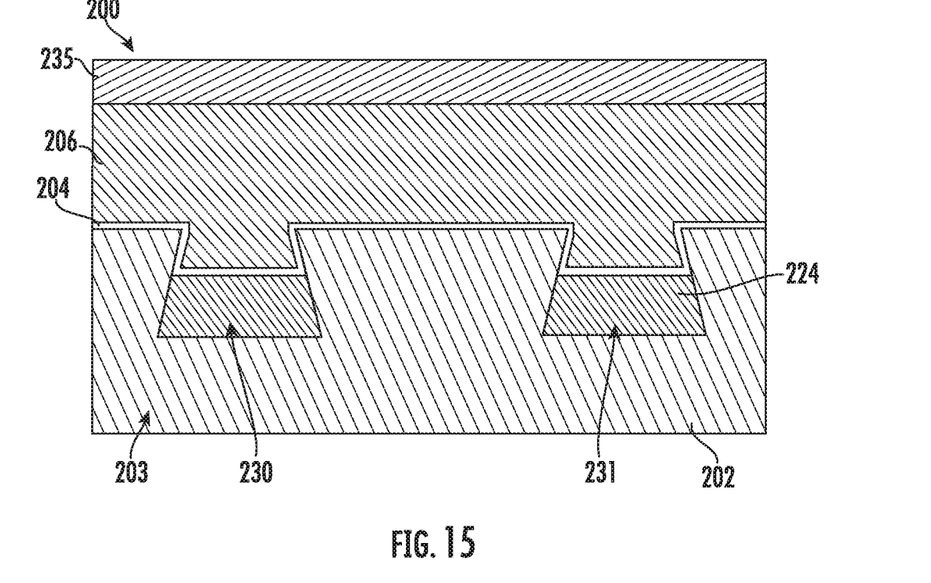
FIG. 15 depicts a side cross-sectional view of a semiconductor device including a dummy gate material and a second hardmask in accordance with embodiments of the present disclosure.

As shown in FIG. 15, a dummy gate material 206 may then be formed over the device 200, including partially within the first and second trenches 230, 231. In some embodiments, the dummy gate material 206 may be polysilicon. A second hardmask 235 may then be formed over the dummy gate material 206. In some embodiments, the second hardmask 235 is a silicon nitride.

Figure 16:
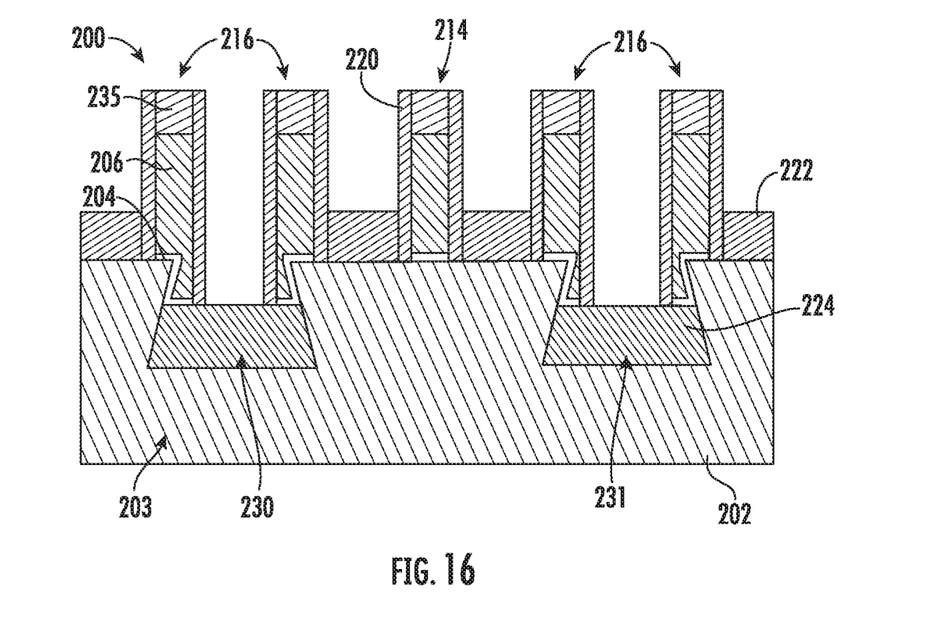
FIG. 16 depicts a side cross-sectional view of a semiconductor device including a set of active gates and a set of dummy gates in accordance with embodiments of the present disclosure.

As shown in FIG. 16, a set of active gates 214 and a set of dummy gates 216 may then be patterned from the dummy gate material 206 and the second hardmask 235. In some embodiments, the set of active gates 214 and the set of dummy gates 216 each include a gate spacer 220 formed along the sides thereof. During formation, the gate spacer 220 may be deposited over the device 200 and then removed from atop the set of active gates 214 and the set of dummy gates 216 via CMP. A S/D epitaxial layer 222 may then be formed atop the substrate 202, between the set of active gates 214 and the set of dummy gates 216.

Figure 17:
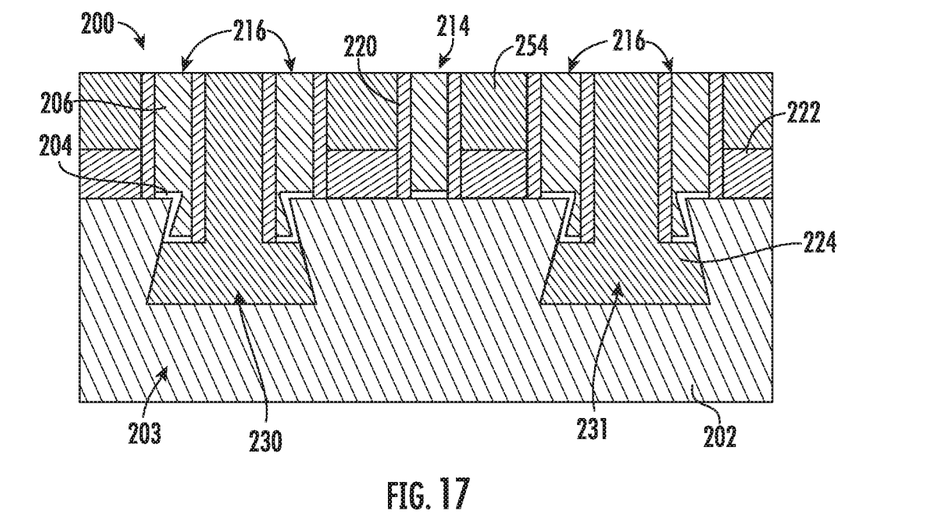
FIG. 17 depicts a side cross-sectional view of a semiconductor device including an isolation silicon oxide in accordance with embodiments of the present disclosure.

As shown in FIG. 17, the second hardmask 235 may be removed, for example, by CMP, and an isolation silicon oxide 254 may be formed over the S/D epitaxial layer 222 and atop the ILD 224 within the first and second trenches 230, 231. In some embodiments, a CMP is performed to expose the dummy gate material 206 within the set of active gates 214 and the set of dummy gates 216.

Figure 18:
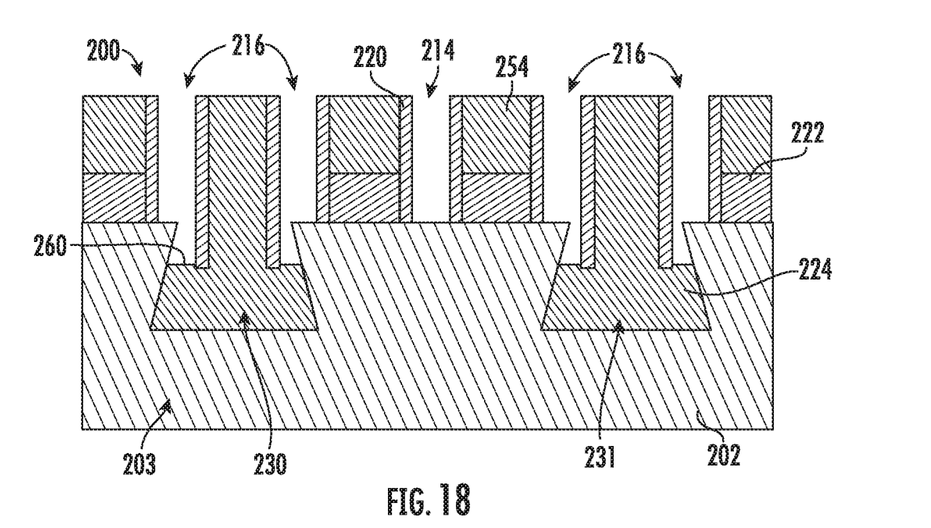
FIG. 18 depicts a side cross-sectional view of a semiconductor device with the dummy gate material and the etch stop material removed from the set of active gates and from the set of dummy gates in accordance with embodiments of the present disclosure.

As shown in FIG. 18, the etch stop layer 204 and the dummy gate material 206 are then removed from the set of active gates 214 and from the set of dummy gates 216. In some embodiments, the dummy gate material 206 may be removed within the set of active gates 214 and within the set of dummy gates 216 selective to a top surface 260 of the ILD 224 within the first and second trenches 231, 232.

Figure 19:
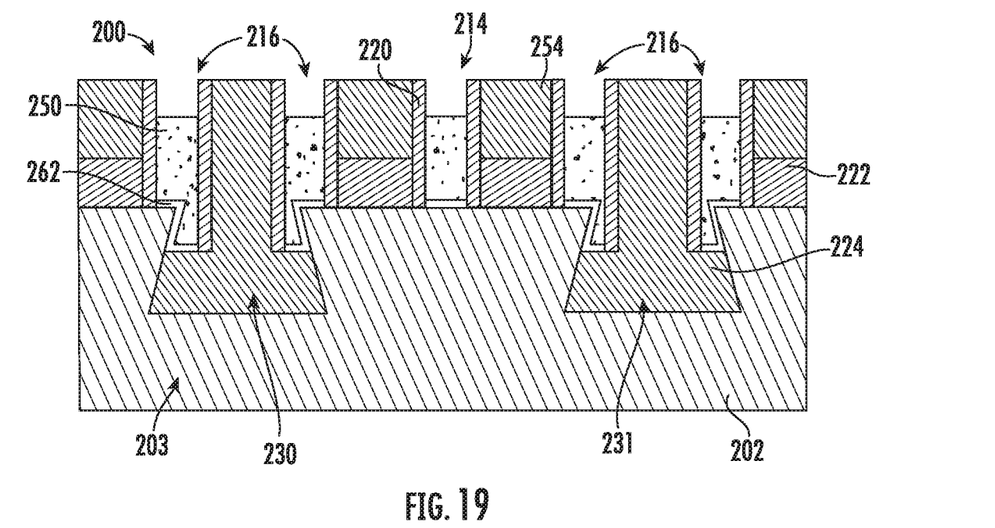
FIG. 19 depicts a side cross-sectional view of a semiconductor device including a gate dielectric and a metal formed in a set of active gates in accordance with embodiments of the present disclosure.
Figure 20:
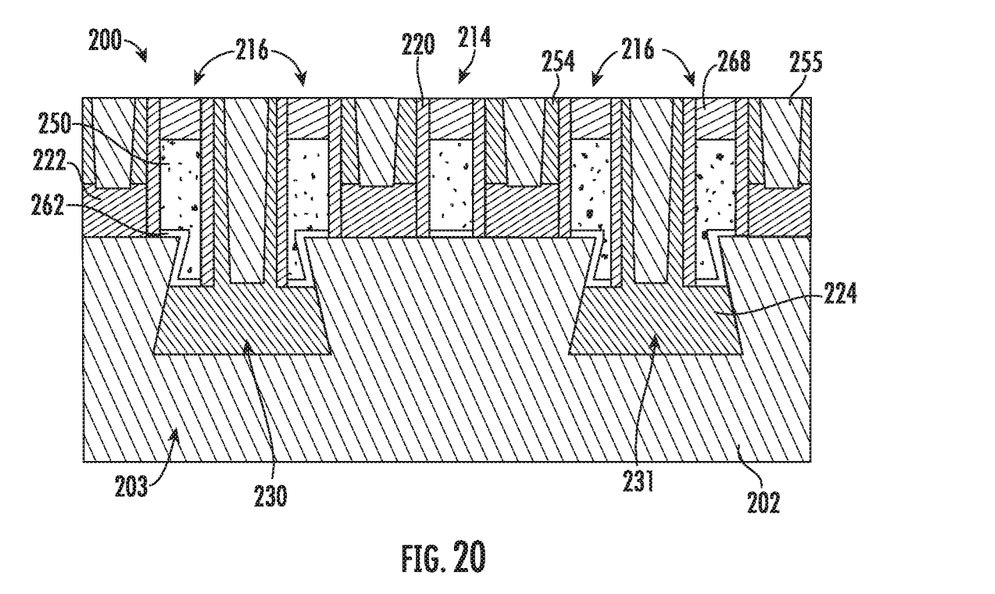
FIG. 20 depicts a side cross-sectional view of a semiconductor device including a capping layer and a set of source/drain contacts in accordance with embodiments of the present disclosure.

As shown in FIG. 19, a gate dielectric 262 may be formed within the set of active gates 214 and the set of dummy gates 216, and a metal 250 is deposited atop the gate dielectric 262. The metal 250 may then be recessed, as shown, and a capping layer 268 may be formed over the metal 250 within the set of active gates 214 and the set of dummy gates 214, as shown in FIG. 20. A set of S/D contacts 255 may then be formed in the device 200, for example, between the set of active gates 214 and the set of dummy gates 216.

In various embodiments, design tools can be provided and configured to create the datasets used to pattern the semiconductor layers of devices 100 and 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

In view of the foregoing, at least the following advantages are achieved by the embodiments disclosed herein. A first advantage includes an etch profile for better isolation using an angled RIE for fin cut process. A second advantage includes a shallower trench depth as compared to isolation of conventional devices. By increasing the width of the bottom of the trench relative to the top of the trench, a more gap-fill friendly design may be achieved.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a semiconductor device, comprising:
    forming an etch stop layer and a dummy gate material over a substrate;
    forming a hardmask layer over the dummy gate material;
    patterning a set of features atop the substrate to form a set of active gates and a dummy gate from the dummy gate material and the hardmask layer;
    forming a gate spacer along the set of active gates and the dummy gate; and
    forming a diffusion break trench in the substrate beneath the dummy gate using angled ions impacting the substrate at a non-zero angle of inclination with respect to a perpendicular to a plane of the substrate, wherein the diffusion break trench has a first width at a bottom of the diffusion break trench and a second width at a top of the diffusion break trench, and wherein the first width is greater than the second width.

2. The method of claim 1, further comprising:
    forming a source/drain (S/D) epitaxial layer over the substrate;
    forming a silicon oxide layer over the S/D epitaxial layer; and
    patterning an opening in a mask, the opening positioned over the dummy gate.

3. The method of claim 1, further comprising:
    opening the dummy gate by removing, from the dummy gate, the following: the etch stop layer, the dummy gate material, and the silicon nitride layer; and
    performing the angled etch after the dummy gate is opened.

4. The method of claim 1, further comprising:
    forming a barrier layer within the diffusion break trench; and depositing an interlayer dielectric over the barrier layer within the diffusion break trench.

5. The method of claim 4, further comprising:
opening the set of active gates by removing from the set of active gates the following: the etch stop layer, the dummy gate material, the silicon nitride layer, and the barrier layer;
forming a gate dielectric within the set of active gates;
depositing a metal over the gate dielectric within the set of active gates;
recessing the gate dielectric and the metal within the set of active gates;
forming a capping layer over the gate dielectric and the metal within the set of active gates; and
forming a set of S/D contacts adjacent the set of active gates.

6. The method of claim 1, further comprising forming a second diffusion break trench in the substrate by performing the angled etch disposed at the non-zero angle of inclination with respect to the perpendicular to the plane of the substrate, wherein the second diffusion break trench has a first width at a bottom of the second diffusion break trench and a second width at a top of the second diffusion break trench, and wherein the first width is greater than the second width.

7. The method of claim 6, further comprising:
forming a silicon nitride layer over the substrate;
forming an optical planarization layer (OPL) and a photoresist over the silicon nitride layer;
patterning a set of openings through the OPL and the photoresist; and
forming the first diffusion break trench and the second diffusion break trench into the substrate following the patterning of the set of openings.

8. The method of claim 7, further comprising:
forming an interlayer dielectric (ILD) within the first diffusion break trench and the second diffusion break trench, wherein the etch stop layer is formed over the ILD, and wherein the dummy gate material is formed over the etch stop layer;
patterning the set of active gates, the dummy gate, and a second dummy gate from the dummy gate material and the hardmask layer;
forming the gate spacer along the set of active gates, the dummy gate and the second dummy gate;
forming a source/drain (S/D) epitaxial layer over the substrate adjacent the dummy gate, and the second dummy gate; and
depositing an isolation silicon oxide over the S/D epitaxial layer and atop the (ILD) within the first diffusion break trench and the second diffusion break trench.

9. The method of claim 7, further comprising:
removing, from the dummy gate, the second dummy gate, and the set of active gates, the following: the etch stop layer, the dummy gate material, and the hardmask layer;
forming a gate dielectric within the set of active gates, the dummy gate, and the second dummy gate;
depositing a metal over the gate dielectric within the set of active gates, the dummy gate, and the second dummy gate;
recessing the gate dielectric and the metal within the set of active gates, the dummy gate, and the second dummy gate;
forming a capping layer over the gate dielectric and the metal within the set of active gates; and
forming a set of S/D contacts between the set of active gates and between the dummy gate and the second dummy gate.

* * * * *